(12) United States Patent
Cho et al.

(10) Patent No.: US 10,103,353 B2
(45) Date of Patent: Oct. 16, 2018

(54) ENCAPSULATION FILM AND ORGANIC ELECTRONIC DEVICE COMPRISING THE SAME

(71) Applicant: LG CHEM, LTD., Seoul (KR)

(72) Inventors: Yoon Gyung Cho, Daejeon (KR); Hyun Jee Yoo, Daejeon (KR); Kyung Yul Bae, Daejeon (KR); Suk Ky Chang, Daejeon (KR); Jung Hyoung Lee, Daejeon (KR); Jun Rye Choi, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 15/129,349

(22) PCT Filed: Mar. 27, 2015

(86) PCT No.: PCT/KR2015/003067
§ 371 (c)(1),
(2) Date: Sep. 26, 2016

(87) PCT Pub. No.: WO2015/147600
PCT Pub. Date: Oct. 1, 2015

(65) Prior Publication Data
US 2017/0222183 A1  Aug. 3, 2017

(30) Foreign Application Priority Data

Mar. 27, 2014 (KR) ................. 10-2014-0035825
Mar. 27, 2015 (KR) ................. 10-2015-0043390

(51) Int. Cl.
*H01L 51/52* (2006.01)
*H01L 23/26* (2006.01)
*H01L 51/56* (2006.01)

(52) U.S. Cl.
CPC .......... *H01L 51/5253* (2013.01); *H01L 23/26* (2013.01); *H01L 51/5237* (2013.01);
(Continued)

(58) Field of Classification Search
CPC ............. H01L 51/5268; H01L 51/5259; H01L 51/5237; H01L 51/5246; H01L 23/26; H01L 51/5253; F26B 21/083
See application file for complete search history.

(56) References Cited

U.S. PATENT DOCUMENTS 5,200,970 A * 4/1993 Klopotek .............. H01S 3/0305
372/55
6,226,890 B1  5/2001 Boroson et al.
(Continued)

FOREIGN PATENT DOCUMENTS

CN  1669362 A  9/2005
CN  1832643 A  9/2006
(Continued)

OTHER PUBLICATIONS

Anonimous: "Refractive Index of Amorphous Polymers", XP-055416666, Polymer Properties database, Retrieved from the internet: URL: http://polymerdatabase.com/polymer physics/RefIndex Table.html (retrieved on Oct. 18, 2017).

*Primary Examiner* — Eduardo A Rodela
*Assistant Examiner* — Nilufa Rahim
(74) *Attorney, Agent, or Firm* — Dentons US LLP

(57) ABSTRACT

The present application relates to an encapsulation film and an organic electronic device including the encapsulation film, and provides an encapsulation film and an organic electronic device which effectively prevents the penetration of moisture or oxygen from the outside into the organic electronic device and also achieves the light diffusion and extraction effects.

15 Claims, 1 Drawing Sheet

(52) U.S. Cl.
CPC ...... *H01L 51/5259* (2013.01); *H01L 51/5268* (2013.01); *H01L 51/56* (2013.01); *H01L 2251/301* (2013.01)

(56) References Cited

U.S. PATENT DOCUMENTS

| | | | |
|---|---|---|---|
| 9,601,721 B2 | 3/2017 | Lang et al. | |
| 2005/0255285 A1* | 11/2005 | Uchibori | H01L 23/26 428/76 |
| 2006/0132034 A1 | 6/2006 | Cho et al. | |
| 2007/0152212 A1* | 7/2007 | Cho | H01L 51/5256 257/40 |
| 2009/0130941 A1* | 5/2009 | Boroson | H01L 51/5237 445/25 |
| 2011/0171764 A1 | 7/2011 | Toonen et al. | |
| 2012/0181914 A1* | 7/2012 | Fukuda | B32B 15/08 313/46 |
| 2012/0313508 A1 | 12/2012 | Son et al. | |
| 2014/0246665 A1 | 9/2014 | Lang et al. | |
| 2014/0318707 A1 | 10/2014 | Cho et al. | |
| 2016/0020426 A1* | 1/2016 | Aoyama | C08L 9/00 524/499 |

FOREIGN PATENT DOCUMENTS

| | | |
|---|---|---|
| CN | 1992371 A | 7/2007 |
| DE | 19603746 A1 | 4/1997 |
| EP | 2857471 B1 | 9/2017 |
| JP | 2002-194066 A | 7/2002 |
| JP | 2007-035550 A | 2/2007 |
| JP | 2007-184279 A | 7/2007 |
| JP | 2011-517011 A | 5/2011 |
| JP | 2012-97282 A | 5/2012 |
| JP | 5435520 B1 | 3/2014 |
| JP | 2014-532271 A | 12/2014 |
| KR | 10-2006-0070166 A | 6/2006 |
| KR | 10-2013-0081261 A | 7/2013 |
| KR | 10-2014-0024040 A | 2/2014 |
| TW | 201208169 A1 | 2/2012 |
| TW | 201341495 A | 10/2013 |
| TW | 201347983 A | 12/2013 |
| WO | 2011016408 A1 | 2/2011 |
| WO | 2013053805 A1 | 4/2013 |
| WO | 2013/103281 A1 | 7/2013 |
| WO | 2013/180536 A1 | 12/2013 |

* cited by examiner

ENCAPSULATION FILM AND ORGANIC ELECTRONIC DEVICE COMPRISING THE SAME

This application is a National Stage Application of International Application No. PCT/KR2015/003067 filed on Mar. 27, 2015, which claims the benefit of Korean Patent Application No. 10-2014-0035825 filed on Mar. 27, 2014 and Korean Patent Application No. 10-2015-0043390 filed on Mar. 27, 2015, all of which are hereby incorporated by reference in their entirety for all purposes as if fully set forth herein.

BACKGROUND

1. Field of the Invention

The present application relates to an encapsulation film, an organic electronic device including the encapsulation film, and a method of manufacturing an organic electronic device using the encapsulation film.

2. Discussion of Related Art

An organic electronic device (OED) denotes a device including an organic material layer generating a flow of charges using holes and electrons, and for example, there are a photovoltaic device, a rectifier, a transmitter, an organic light emitting diode (OLED), etc.

Among the OEDs, an OLED has less power consumption and a higher response speed, and forms a thinner display device or lighting than a conventional light source. Further, the OLED has excellent space utilization, and is expected to be applied in a variety of fields including all various types of portable devices, monitors, notebook computers and TVs.

To extend the compatibility and use of the OLED, a major problem is durability. Organic materials and metal electrodes included in the OLED are too easily oxidized by external factors such as moisture, etc. Therefore, a product including the OLED is very sensitive to environmental factors. Accordingly, a variety of methods have been suggested to effectively prevent the penetration of oxygen or moisture from an external environment with respect to an OED such as the OLED, or the like. For example, Patent document 1 discloses one of the methods.

Further, a backlight unit of an OLED display apparatus includes a diffusion film, and the diffusion film is required to serve for diffusing light generated from a light source to conceal the image of the light source and maintaining the luminance of the entire screen without affecting the brightness of the light source. A diffusion film scatters light, which is emitted from a light-guiding plate and incident to a display screen, so as to allow the luminance distribution of light to be uniform, and examples of the diffusion film include a transparent film in which a transparent filler is dispersed on the surface of a transparent polyester film, a specular reflection film prepared by laminating silver thin films, and a milky white colored-diffuse reflective film which diffuses whitely like a paper.

[Patent Document 1]
(Patent document 1) U.S. Pat. No. 6,226,890

SUMMARY OF THE INVENTION

The present application is directed to providing an encapsulation film which effectively prevents the penetration of oxygen or moisture from the outside into an organic electronic device, and also achieves both light diffusion and light extraction effects, and an organic electronic device including the encapsulation film.

Hereinafter, exemplary embodiments of the present application will be described in detail in conjunction with the accompanying drawings. Further, in the description of the present application, general functions or constitutions well known in the related art are omitted. Further, the accompanying drawings are schematic views for the purpose of understanding the present application, and any parts unrelated to the description were omitted for clarity of explanation. In the drawings, a thickness or a size was expanded for a clear expression of various layers and areas. The scope of the present application is not limited to thicknesses, sizes, ratios, or the like shown in the drawings.

The present application relates to an encapsulation film. The encapsulation film may be applied to the encapsulation of an organic electronic element. For example, the encapsulation film according to an embodiment of the present application may be applied to a side to which light is transmitted in an organic electronic device such as OLED, etc.

In the present specification, the term "organic electronic device" denotes a product or device which has a structure including an organic material layer generating a flow of charges using holes and electrons between a pair of electrodes opposite to each other, and a photovoltaic device, a rectifier, a transmitter, an organic light emitting diode (OLED), and the like are examples thereof, but the device is not limited thereto. In the embodiment of the present application, the organic electronic device may be an OLED.

An exemplary encapsulation film may be formed with a single layer or two or more layers. In the embodiment, when the encapsulation film is formed with two or more layers, the encapsulation film may include a first layer and a second layer which will be described below.

In one embodiment, the encapsulation film may include an encapsulating layer having an encapsulation resin, a hygroscopic filler and a non-hygroscopic filler. The encapsulating layer may include a hygroscopic filler at 1 to 40 parts by weight and a non-hygroscopic filler at 1 to 10 parts by weight. Further, an encapsulation film may have a light transmittance of 70% or more with respect to a visible light region, and a haze of 50% or more.

In the present specification, the unit "parts by weight" denotes the weight ratio between the components.

When an encapsulation film is formed with two or more layers, the encapsulation film may include at least one first layer and at least one second layer as described above, the first layer may include the encapsulation resin and the hygroscopic filler, and the second layer may include the encapsulation resin and the non-hygroscopic filler. In the embodiment, a first layer may not include the non-hygroscopic filler, and a second layer may not include the hygroscopic filler. Referring to FIGS. 1 and 2, specifically, as shown in FIG. 1, when an encapsulating layer according to the embodiment of the present application is formed with a single layer, the single layer may form the encapsulating layer 3, and the single layer may include a hygroscopic filler 4 and a non-hygroscopic filler 5. However, as shown in FIG. 2, when the encapsulating layer is formed with two or more layers, the encapsulating layer 3 may include a first layer 3a having the hygroscopic filler 4 and a second layer 3b having the non-hygroscopic filler 5. In this case, both the first layer 3a and the second layer 3b may form the encapsulating layer 3, and the stacking order of the first layer 3a and the second layer 3b is not particularly limited. The first layer may be directly adhered to the second layer. In the present specification, "directly adhered" may denote that other layers are not interposed between the two layers. The compositions forming the first layer 3*a* and the second layer 3*b* may be identical or different except for the above-described types of the fillers. For example, the encapsulation resins, dispersants, or the like of the first layer 3*a* and the second layer 3*b* may be identical or different.

The thicknesses of the first and second layers may be identical or different. In one embodiment, the thickness of the first layer may be in the range of 10 to 100 μm, 10 to 80 μm, 20 to 60 μm, or 20 to 40 μm, the thickness of the second layer may be in the range of 10 to 100 μm, 10 to 60 μm, 15 to 40 μm, or 15 to 30 μm. When the thickness of each layer is set to 10 μm or more as described above, impact resistance may be ensured. Further, when the thickness of each layer is set to 100 μm or less, the penetration of water into a side surface thereof may be suppressed. Further, the thickness of the second layer may be 30 μm or less in terms of suitable moisture barrier properties. In one embodiment, the thickness ratio of the thickness of the second layer to the thickness of the first layer may be 1 or more, 1.1 or more, 1.2 or more or 1.3 or more. When an encapsulating layer is formed with a single layer, the thickness of the single layer may be in the range of 10 to 100 μm, 10 to 95 μm, 10 to 90 μm, 13 to 85 μm, 15 to 80 μm, 20 to 70 μm or 25 to 65 μm. When the encapsulation film according to the embodiment of the present application is controlled to have a thickness range as described above as well as the above-described content range, both the moisture barrier effect and light extraction efficiency can be effectively achieved.

As described above, the encapsulation film may have excellent light transmittance in the visible light region. In one embodiment, the encapsulation film according to the embodiment of the present application may have a light transmittance of 80% or more with respect to the visible light region. In the embodiment of the present application, an encapsulation film including the encapsulating layer may maintain transparency thereof. For example, an encapsulation film, which is formed by drying an encapsulating layer which has a hygroscopic filler or a non-hygroscopic filler and applying and drying the encapsulating layer such that the thickness of the encapsulating layer is 50 μm, may have a light transmittance of 80% or more, 81% or more, 82% or more or 83% or more in the visible light region.

Further, the haze of the encapsulation film may be adjusted together with the excellent light transmittance thereof. In one embodiment, when the encapsulating layer is combined as described above, the non-hygroscopic filler may provide the haze properties of the encapsulating layer, and thus, the encapsulation film having the adjusted haze may be provided. For example, an encapsulation film formed under the same conditions as the conditions for the light transmittance measurement may have a haze of 50% or more, 55% or more, 60% or more, 70% or more, 73% or more or 75% or more. The higher the haze value is, the more the light extraction efficiency may be improved, and thus, the upper limit of a haze is not particularly limited, and for example, may be 100%.

In the above description, regarding the light transmittance and haze, for example, the light transmittance may be measured in a wavelength of 550 nm using a UV-Vis spectrometer with respect to the encapsulation film, and the haze may be measured according to a JIS K 7105 standard test method using a haze meter with respect to the encapsulation film.

According to the embodiment of the present application, when the encapsulating layer includes both the hygroscopic filler and the non-hygroscopic filler, or includes the first layer having the hygroscopic filler and the second layer having the non-hygroscopic filler, the light transmittance of the entire encapsulating layer may be 70% or more as described above, and the haze thereof may be 50% or more. According to the embodiment of the present application, a non-hygroscopic filler may be included in addition to a hygroscopic filler, and light scattering is optimized while transmittance thereof is maintained as high as possible so as to optimize the light extraction efficiency.

The light transmittance or haze of the encapsulation film may be achieved by controlling the type of the hygroscopic filler or non-hygroscopic filler, the content ratio, the average particle diameters, the refractive index difference or the like of the fillers which will be described below.

In one embodiment, the water vapor transmission rate (WVTR) of the encapsulating layer of the encapsulation film may be 50 g/m²·day or less, preferably 30 g/m²·day or less, more preferably 20 g/m²·day or less, and even more preferably 15 g/m²·day or less. In the embodiment of the present application, the water vapor transmission rate is the water vapor transmission rate of an encapsulating layer measured in the thickness direction of the encapsulating layer under conditions of 38° C. and a relative humidity of 100%, after forming the film-shaped encapsulating layer having a thickness of 100 μm. Further, the water vapor transmission rate is measured according to ASTM F1249. According to the embodiment of the present application, the light diffusion and extraction effects may be achieved by controlling the light transmittance and haze to be in the above-described numerical range, and the moisture barrier properties may be achieved as well as the light diffusion and extraction effects by further controlling the water vapor transmission rate in the above-described numerical range as described above. The lower the water vapor transmission rate is, the more excellent the moisture barrier properties are, and thus, the lower limit of the water vapor transmission rate is not particularly limited, and may be 0 g/m²·day or 0.001 g/m²·day.

As described above, the encapsulating layer of the encapsulation film may include a hygroscopic filler at 1 to 40 parts by weight and a non-hygroscopic filler at 1 to 10 parts by weight. That is, when the encapsulating layer is formed with a single layer, 1 to 40 parts by weight of the hygroscopic filler and 1 to 10 parts by weight of the non-hygroscopic filler may be included in the encapsulating layer. When the encapsulating layer is formed with two or more layers, the hygroscopic filler may be included in a first layer, a non-hygroscopic filler may be included in a second layer, and the encapsulating layer may contain the hygroscopic filler included in the first layer at 1 to 40 parts by weight and the non-hygroscopic filler included in the second layer at 1 to 10 parts by weight. Specifically, the weight ratio between the hygroscopic filler and the non-hygroscopic filler included in the encapsulating layer may be 1 to 40 parts by weight and 1 to 10 parts by weight; 1 to 35 parts by weight and 1 to 9 parts by weight; 1 to 30 parts by weight and 1 to 8 parts by weight; 1 to 25 parts by weight and 1 to 7 parts by weight; 1 to 20 parts by weight and 1 to 6 parts by weight; 1 to 15 parts by weight and 1 to 6 parts by weight; 2 to 13 parts by weight and 2 to 6 parts by weight; or 3 to 12 parts by weight and 2 to 5 parts by weight. The encapsulation film according to the embodiment of the present application may effectively prevent the penetration of moisture or oxygen into an organic electronic device, and may also achieve the light diffusion and extraction effects by controlling the contents of the hygroscopic filler and the non-hygroscopic filler as described above.

The average particle diameter of the hygroscopic filler according to the embodiment of the present application may be, for example, in the range of 10 nm to 5 µm, 20 nm to 5 µm, 30 nm to 4 µm, 40 nm to 4 µm, 50 nm to 3 µm, 60 nm to 3 µm, 70 nm to 2 µm, 80 nm to 2 µm, 90 nm to 1 µm, or 100 nm to 1 µm. The transparency of the film may be ensured by adjusting the average particle diameter of the hygroscopic filler to 5 µm or less, and thus, the light transmittance value desired in the embodiment of the present application may be achieved, and the effect of blocking the absorption of moisture from the outside may be achieved by adjusting the average particle diameter of the hygroscopic filler to 10 nm or more. Further, according to the embodiment of the present application, the moisture barrier properties and the light diffusion and extraction effects of the encapsulation film may be effectively realized by adjusting the particle diameter of the hygroscopic filler in the above-described range together with the non-hygroscopic filler.

Further, the hygroscopic filler may be included at 0.1 to 40 parts by weight, 0.3 to 35 parts by weight, 0.5 to 30 parts by weight, 0.7 to 25 parts by weight, 1.0 to 20 parts by weight, 1.5 to 15 parts by weight, 2.0 to 13 parts by weight or 3.0 to 12 parts by weight with respect to 100 parts by weight of an encapsulation resin. In the above description, when the encapsulating layer has two or more layers, the weight ratio of the hygroscopic filler denotes the weight ratio with respect to the resin of the entire encapsulating layer. According to the embodiment of the present application, when the content of the hygroscopic filler is adjusted as described above, the light transmittance and haze of the encapsulating layer may be adjusted to be in the desired range, and thereby the encapsulation film having excellent optical properties and moisture barrier properties may be provided.

The type of the hygroscopic filler is not particularly limited insofar as the above-described particle diameters and content ranges are provided. In one embodiment, the hygroscopic filler may be one or more selected from the group consisting of a metal oxide, a metal salt, and phosphorus pentoxide. As specific examples, the hygroscopic filler may include one or more selected from the group consisting of CaO, MgO, $CaCl_2$, $CaCO_3$, $CaZrO_3$, $CaTiO_3$, $SiO_2$, $Ca2SiO_4$, $MgCl_2$, $P_2O_5$, $Li_2O$, $Na_2O$, BaO, $Li_2SO_4$, $Na_2SO_4$, $CaSO_4$, $MgSO_4$, $CoSO_4$, $Ga_2(SO_4)_3$, $Ti(SO_4)_2$, $NiSO_4$, $SrCl_2$, $YCl_3$, $CuCl_2$, CsF, $TaF_5$, $NbF_5$, LiBr, $CaBr_2$, $CeBr_3$, $SeBr_4$, $VBr_3$, $MgBr_2$, $BaI_2$, $MgI_2$, $Ba(ClO_4)_2$ and $Mg(ClO_4)_2$.

In one embodiment, the average particle diameter of the non-hygroscopic filler may be in the range of 500 nm to 10 µm, 550 nm to 8 µm, 600 nm to 6 µm, 650 nm to 5 µm, 700 nm to 4 µm, 750 nm to 3 µm, 800 nm to 2 µm or 900 nm to 1.5 µm. For example, the particle diameter of the non-hygroscopic filler may be greater than that of the above-described hygroscopic filler. When the particle diameter of the non-hygroscopic filler is adjusted to be in the above-described range, the light diffusion and extraction effects may be effectively achieved through the adjustment of the haze, and the reduction of the light extraction effect due to light scattering may be prevented. For example, the average particle diameter ratio of the average particle diameter of the non-hygroscopic filler to the average particle diameter of the hygroscopic filler may be 1 or more, 1.1 or more, 1.2 or more, 1.3 or more, 1.4 or more or 1.5 or more. The upper limit of the average particle diameter ratio of the average particle diameter of the non-hygroscopic filler to the average particle diameter of the hygroscopic filler may be, for example, 2 or less.

The refractive index difference between the non-hygroscopic filler and the hygroscopic filler may be in the range of 0.1 to 1.0, 0.15 to 0.95, 0.2 to 0.9, 0.25 to 0.85, 0.3 to 0.8, 0.35 to 0.75 or 0.4 to 0.7. Further, the refractive index difference between the non-hygroscopic filler and the hygroscopic filler may be in the range of 0.1 to 1.0, 0.15 to 0.95, 0.2 to 0.9, 0.25 to 0.85, 0.3 to 0.8, 0.35 to 0.75 or 0.35 to 0.7. In the present specification, the refractive index of the encapsulation resin may denote the refractive index of the resin itself in the measurement of the refractive index. When the refractive index is specified as described above, the haze may be adjusted, and the light diffusion and extraction effects may be effectively controlled.

The type of the non-hygroscopic filler is not particularly limited insofar as the particle diameter and refractive index are provided as described above, and for example, may be one or more selected from the group consisting of titanium dioxide ($TiO_2$), alumina ($Al_2O_3$), silicon nitride ($Si_3N_4$), aluminum nitride (AlN), gallium nitride (GaN), zinc sulfide (ZnS), cadmium sulfide (CdS), silica, talc, zeolite, titania, zirconia, montmorillonite, and clay. Further, the non-hygroscopic filler may be included at 0.1 to 10 parts by weight, 0.3 to 9.5 parts by weight, 0.5 to 9.3 parts by weight, 0.8 to 9.0 parts by weight, 1.0 to 8.5 parts by weight, 1.5 to 15 parts by weight, or 2.0 to 8.0 parts by weight with respect to 100 parts by weight of an encapsulation resin. In the above description, when the encapsulating layer has two or more layers, the weight ratio of the non-hygroscopic filler denotes the weight ratio with respect to the resin of the entire encapsulating layer.

In one embodiment, the encapsulating layer may include the hygroscopic filler and non-hygroscopic filler at 1 to 60 parts by weight, 3 to 55 parts by weight, 5 to 50 parts by weight, 10 to 45 parts by weight, or 15 to 40 parts by weight with respect to 100 parts by weight of an encapsulation resin. When a large amount of the non-non-hygroscopic filler is included in the encapsulating layer, the lifetime of the organic electronic device may be negatively affected, and thus, the light transmittance and haze of the encapsulating layer may be adjusted to be in the desired range by adjusting the contents of the hygroscopic filler and non-hygroscopic filler as described above.

In the present specification, the term "filler" may refer to the hygroscopic filler or the non-hygroscopic filler, and also may denote the collective term of the two types of the fillers.

In the present specification, the term "encapsulation resin" refers to a main component forming an encapsulating layer, and specifically, may include a pressure-sensitive adhesive resin or an adhesive resin which will be described below.

In one embodiment, the type of the encapsulation resin is not particularly limited. In one embodiment, the encapsulation resin may have a water vapor transmission rate of 50 $g/m^2 \cdot day$ or less, preferably 30 $g/m^2 \cdot day$ or less, more preferably 20 $g/m^2 \cdot day$ or less, even more preferably 15 $g/m^2 \cdot day$ or less in the cured state or cross-linked state. The term "the cured state or cross-linked state of the encapsulation resin" denotes the state in which the encapsulation resin is cured or cross-linked independently or through the reaction with other components such as a curing agent, a cross-linking agent or the like, and thereby changed to be capable of exhibiting the function of the structural adhesive upon being applied to an encapsulant. In the embodiment of the present application, the water vapor transmission rate refers to the water vapor transmission rate measured in the thickness direction of the cured material or cross-linked material under conditions of 38° C. and a relative humidity of 100%, after the encapsulation resin is cured and crosslinked, and formed as a film. Further, the water vapor transmission rate is measured according to ASTM F1249.

For example, examples of the encapsulation resin may include an acrylic resin, an epoxy resin, a silicone resin, a fluorine resin, a styrene resin, a polyolefin resin, a thermoplastic elastomer, a polyoxyalkylene resin, a polyester resin, a polyvinyl chloride resin, a polycarbonate resin, a polyphenylene sulfide resin, a polyamide resin, mixtures thereof, etc.

In the above-description, an example of the styrene resin may include a styrene-ethylene-butadiene-styrene block copolymer (SEBS), a styrene-isoprene-styrene block copolymer (SIS), an acrylonitrile-butadiene-styrene block copolymer (ABS), an acrylonitrile-styrene-acrylate block copolymer (ASA), a styrene-butadiene-styrene block copolymer (SBS), a styrene-based homopolymer or a mixture thereof. An example of the polyolefin resin may include a high-density polyethylene resin, a low-density polyethylene resin, a polypropylene resin or a mixture thereof. An example of the thermoplastic elastomer may include an ester-based thermoplastic elastomer, an olefin-based thermoplastic elastomer or a mixture thereof. As the olefin-based thermoplastic elastomer, a polybutadiene resin, a polyisobutylene resin, or the like may be used. An example of the polyoxyalkylene resin may include a polyoxymethylene-based resin, a polyoxyethylene-based resin, a mixture thereof, etc. An examples of the polyester resin may include a polyethylene terephthalate-based resin, a polybutylene terephthalate-based resin, a mixture thereof, etc. An example of the polyvinyl chloride resin may include polyvinylidene chloride, etc. Further, the mixture of hydrocarbon resins may be included, and examples of the hydrocarbon resin may include hexatriacotane, paraffin, etc. An example of the polyamide resin may include nylon, etc. An example of the acrylate resin may include a polybutyl (meth) acrylate, etc. An example of the silicone resin may include polydimethylsiloxane, etc. Further, examples of the fluorine resin may include a polytrifluoroethylene resin, a polytetrafluoroethylene resin, a polychlorotrifluoro ethylene resin, a poly hexafluoropropylene resin, polyvinylidene fluoride, polyvinyl fluoride, polyethylene propylene fluoride, a mixture thereof, etc.

For example, the above-described resin may be grafted with maleic anhydride, copolymerized with another above-described resin or a monomer to prepare the resin, and modified by the other compound to be used. An example of the other compound may include a carboxyl-terminated butadiene-acrylonitrile copolymer, etc.

In one embodiment, the encapsulation resin of an encapsulating resin composition may include a polyisobutylene resin. The polyisobutylene resin has hydrophobicity, and thus may have a low water vapor transmission rate and surface energy. Specifically, an example of the polyisobutylene resin may include an isobutylene homopolymer, a copolymer prepared by copolymerizing an isobutylene monomer with other monomer polymerizable with the isobutylene monomer, etc. Here, an example of the other monomer polymerizable with the isobutylene monomer may include 1-butene, 2-butene, isoprene, butadiene, etc. In one embodiment, the copolymer may be a butyl rubber.

An example of a component of the encapsulation resin may include a base resin having a suitable weight average molecular weight (Mw) at which the encapsulation resin may be formed as a film. In one embodiment, the suitable weight average molecular weight (Mw) at which the encapsulation resin may be formed as a film may be in the range of about 100,000 to 2,000,000, 100,000 to 1,500,000 or 100,000 to 1,000,000. In the present specification, the term "weight average molecular weight" refers to a conversion value with respect to a polystyrene measured using a gel permeation chromatograph (GPC).

Further, one type or two or more types of the above-described compositions may be used as the encapsulation resin. When two or more types of the composition are used, two or more different types of the resin, two or more types of the resin having different weight average molecular weights, or two or more different types of the resin having different weight average molecular weight may be used.

In another embodiment, the encapsulation resin according to the embodiment of the present application may be a curable resin. The specific type of the curable resin which may be used in the embodiment of the present application is not particularly limited, and for example, various thermosetting or photocurable resins known in the related field may be used. The term "thermosetting resin" refers to a resin which may be cured through the application of a suitable heating and aging process, and the term "photocurable resin" refers to a resin which may be cured by being irradiated with electromagnetic waves. Further, the curable resin may be a dual curable resin including the characteristics of both thermosetting and photocurable resins. In one embodiment, the curable resin according to the embodiment of the present application may be preferably a thermosetting resin instead of a photocurable resin considering that the curable resin forms an encapsulation resin together with a light absorption material which will be described below, but the present application is not limited thereto.

In the embodiment of the present application, the specific type of the curable resin is not particularly limited insofar as the curable resin has the above-described characteristics. For example, an example of the resin which may exhibit adhesive properties after curing may include a resin including at least one thermosetting functional group such as a glycidyl group, an isocyanate group, a hydroxyl group, a carboxyl group, an amide group, or the like, or at least one functional group which may be cured by being irradiated with electromagnetic waves, such as an epoxide group, a cyclic ether group, a sulfide group, an acetal group, a lactone group, etc. Further, an example of the specific type of the above-described resin may include an acrylic resin, a polyester resin, an isocyanate resin, an epoxy resin, or the like, but is not limited thereto.

In the embodiment of the present application, an aromatic or aliphatic epoxy resin; or an epoxy resin having a linear or branched chain may be used as the curable resin. In one embodiment of the present application, the epoxy resin which has two or more functional groups and an epoxy equivalent in the range of 180 to 1,000 g/eq may be used. The characteristics such as the adhesive performance, glass transition temperature and the like of the cured material may be effectively maintained using the epoxy resin having the epoxy equivalent in the above-described range. An example of the epoxy resin as described above may include one type or a mixture of two or more types of a cresol novolac epoxy resin, a bisphenol A type epoxy resin, a bisphenol A type novolak epoxy resin, a phenol novolak epoxy resin, a 4-functional epoxy resin, a biphenyl type epoxy resin, a triphenol methane type epoxy resin, an alkyl-modified triphenol methane epoxy resin, a naphthalene type epoxy resin, a dicyclopentadiene type epoxy resin or a dicyclopentadiene-modified phenol type epoxy resin.

In the embodiment of the present application, as the curable resin, the epoxy resin including a cyclic structure in the molecule structure may be used, and the epoxy resin including an aromatic group (e.g., phenyl group) may be used. When the epoxy resin includes an aromatic group, the cured material has excellent thermal and chemical stability, and a low absorption capacity, and thus the reliability of the encapsulation structure of the organic electronic device may be improved. A specific example of the epoxy resin containing an aromatic group which may be used in the embodiment of the present application may include one type or a mixture of two or more types of a biphenyl-type epoxy resin, a dicyclopentadiene-type epoxy resin, a naphthalene-type epoxy resin, a dicyclopentadiene-modified phenol type epoxy resin, a cresol-based epoxy resin, a bisphenol-type epoxy resin, a xylok-based epoxy resin, a polyfunctional epoxy resin, a phenol novolac epoxy resin, a triphenol methane type epoxy resin and an alkyl triphenol-modified methane epoxy resin, but is not limited thereto.

In the embodiment of the present application, a silane-modified epoxy resin, or a silane-modified epoxy resin having an aromatic group may be used as the epoxy resin. When the epoxy resin which is modified with silane and structurally has a silane group is used, the adhesion between the encapsulating layer and the glass substrate or inorganic substrate of the organic electronic device may be maximized, and moisture barrier properties and reliability may be improved. The specific type of the above-described epoxy resin which may be used in the embodiment of the present application is not particularly limited, and for example, the above-described resin may be easily obtained from a vendor such as Kukdo Chemical Co., Ltd.

In the specific embodiment of the present application, the encapsulating layer may further include a dispersant so as to uniformly disperse an encapsulation resin, a hygroscopic filler or a non-hygroscopic filler. For example, a nonionic surfactant or the like which has chemical affinity with the surfaces of a hygroscopic filler and a non-hygroscopic filler, and has a compatibility with an encapsulation resin may be used as a dispersant which may be used herein. It may be required to consider that a hygroscopic filler and a non-hygroscopic filler should effectively realize the light diffusion and extraction effects as well as the moisture barrier properties in the selection of a suitable dispersant.

For example, the dispersant may include one or more selected from the group consisting of stearic acid, palmitic acid, oleic acid, linoleic acid, cetyl alcohol, stearyl alcohol, cetostearyl alcohol, oleyl alcohol, octyl glucoside, decyl glucoside or lauryl glucoside.

Such a content of the dispersant may be controlled according to the type and/or the size of a hygroscopic filler and a non-hygroscopic filler. Specifically, the smaller the sizes of a hygroscopic filler and a non-hygroscopic filler are, the wider the surface areas of a hygroscopic filler and a non-hygroscopic filler are, and thus a hygroscopic filler and a non-hygroscopic filler may be uniformly dispersed by using a large amount of the dispersant. Accordingly, the dispersant is included at 0.1 to 5 parts by weight, 0.2 to 4.5 parts by weight, 0.3 to 4.3 parts by weight or 0.5 to 4.0 parts by weight with respect to 100 parts by weight of the hygroscopic filler and the non-hygroscopic filler in consideration of the type and/or the size of the hygroscopic filler and the non-hygroscopic filler as described above. When the content of the dispersant is in the above-described range, the hygroscopic filler and the non-hygroscopic filler may be uniformly dispersed without affecting various properties such as an adhesive force or the like of the encapsulation film.

Further, various additives may be included in the encapsulating layer according to the use and the production process of the encapsulation film in addition to the above-described composition. For example, the encapsulating layer may include a curable material, a crosslinking agent, a crosslinkable compound, a polyfunctional active energy ray-polymerizable compound, an initiator, a tackifier, a coupling agent, or the like in a suitable content range according to desired physical properties.

As shown in FIG. 1, the structure of the encapsulation film 1 according to the embodiment of the present application is not particularly limited insofar as the encapsulation film includes the encapsulating layer 3, and for example, the encapsulation film may have a structure including a base film 2 or a release film 2 (hereinafter, may be referred to as a "first film"); and the encapsulating layer 3 formed on the base film or release film.

Further, the encapsulation film according to the embodiment of the present application may further include a base film or release film (hereinafter, may be referred to as a "second film") formed on the encapsulating layer.

The specific type of the first film which may be used in the embodiment of the present application is not particularly limited. In the embodiment of the present application, for example, a general polymer film in the related field may be used as the first film. In the embodiment of the present application, for example, a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film, a polyimide film, or the like may be used as the base or release film 2. Further, a suitable release treatment may be performed on either or both sides of the base film 2 or release film 2 according to the embodiment of the present application. An example of the release agent used in the release treatment of the base film 2 may include an alkyd-based, a silicone-based, a fluorine-based, an unsaturated polyester-based, a polyolefin-based or a wax-based release agent or the like, and among these, it is preferable to use an alkyd-based, a silicone-based or a fluorine-based release agent in terms of the heat resistance, but the present application is not limited thereto.

Further, the type of a second film (hereinafter, may be referred to as a "cover film") which may be used in the embodiment of the present application is also not particularly limited. For example, within the range of the above-described examples of the first film, the film with the same type as the first film or a different type may be used as the second film in the embodiment of the present application. Further, a suitable release treatment may be performed on the second film to be used in the embodiment of the present application.

In the embodiment of the present application, the thickness of the base film 2 or release film 2 (first film) as described above is not particularly limited, and may be suitably selected according to use. For example, the thickness of the first film may be in the range of 10 to 500 μm, and preferably in the range of 20 to 200 μm in the embodiment of the present application. When the thickness of the first film is less than 10 μm, there is a risk in that the base film 2 may be easily deformed in the production process, and when the thickness of the first film is more than 500 μm, economic efficiency may decrease.

Further, the thickness of the second film is also not particularly limited in the embodiment of the present application. In the embodiment of the present application, for example, the thickness of the second film may be set to be identical to the first film. Further, the second film may be set to be relatively thinner than the first film in consideration of processability or the like in the embodiment of the present application.

The present application also relates to a method of producing an encapsulation film. An exemplary encapsulation film may include an encapsulation film prepared by forming the encapsulating composition as a film or a sheet. The encapsulating composition may refer to a main component forming an encapsulating layer, and for example, may refer to an encapsulation resin, a dispersant, a hygroscopic filler, a non-hygroscopic filler, etc.

In one embodiment, the method of producing an encapsulation film may include applying of a coating solution including the encapsulating composition onto a base or release film 2 to form a sheet or film type coating layer, and drying of the applied coating solution. Further, the method of producing an encapsulation film may include adhering of an additional base or release film 2 onto the dried coating solution.

For example, the coating solution including the encapsulating composition may be prepared by dissolving or dispersing each component of the above-described encapsulating composition in a suitable solvent. In one embodiment, the encapsulating composition may be prepared in a manner in which the filler is dissolved or dispersed in a solvent when needed, the filler is milled, and the milled filler is mixed with an encapsulation resin.

The type of a solvent used to prepare a coating solution is not particularly limited. However, when the drying time of a solvent is significantly extended, or drying at a high temperature is needed, there may be a problem in terms of workability or durability of an encapsulation film, and thus a solvent having a volatilization temperature of 150° C. or less may be used. A small amount of a solvent having a volatilization temperature over the above-described range may be further mixed to the solvent in consideration of film formability, etc. An example of the solvent may include one type or two or more types of methyl ethyl ketone (MEK), acetone, toluene, dimethylformamide (DMF), methyl cellosolve (MCS), tetrahydrofuran (THF), xylene, N-methylpyrrolidone (NMP), or the like, but is not limited thereto.

A method of applying the coating solution onto the base or release film 2 is not particularly limited, and for example, a well-known coating method such as a knife-coating method, a roll-coating method, a spray-coating method, a gravure-coating method, a curtain-coating method, a comma-coating method, a lip-coating method, or the like may be used.

The applied coating solution is dried, a solvent is volatilized, and thereby an encapsulating layer may be formed. For example, the drying of the coating solution may be performed at a temperature in the range of 70 to 150° C. for 1 to 10 minutes. The conditions of the drying of the coating solution may be changed in consideration of the type or ratio of the used solvent, or the possibility of curing of a curable pressure-sensitive adhesive resin.

An additional base or release film 2 may be formed on an encapsulating layer, followed by drying. For example, the forming of the base or release film 2 may be performed by compressing the film to an encapsulating layer through a hot-roll lamination or pressing process. The hot-roll lamination method may be used in consideration of the possibility of a continuous process and efficiency. The temperature at which the process is performed may be in the range of about 10 to 100° C., and the pressure may be in the range of about 0.1 to 10 kgf/cm², but the present application is not limited thereto.

The present application also relates to an organic electronic device including a substrate 21; an organic electronic element 23 formed on one surface of the substrate 21; and an encapsulation film 3 formed on the other surface of the substrate as shown in FIG. 3.

The organic electronic element may include a transparent electrode layer, an organic layer which is present on the transparent electrode layer and includes at least one light-emitting layer, and a reflective electrode layer which is present on the organic layer.

The organic electronic device may further include a moisture barrier layer 6 formed on the organic electronic element 23. Further, the organic electronic device may further include a cover substrate 22 formed on the moisture barrier layer 6.

A material forming the moisture barrier layer 6 is not particularly limited, may include the above-described encapsulation resin, and may also further include the above-described hygroscopic filler. For example, an example of the encapsulation resin may include an acrylic resin, an epoxy resin, a silicone resin, a fluorine resin, a styrene resin, a polyolefin resin, a thermoplastic elastomer, a polyoxyalkylene resin, a polyester resin, a polyvinyl chloride resin, a polycarbonate resin, a polyphenylene sulfide resin, a polyamide resin, a mixture thereof, etc.

That is, the light diffusion and extraction effects can be achieved by the above-described encapsulation film 3 formed on one surface of the substrate, and the penetration of moisture or oxygen into an organic electronic device may be effectively prevented at the both sides by the moisture barrier layer 6 formed on the organic electronic element on the other surface of the substrate according to the embodiment of the present application.

In the above-description, the organic electronic element may be, for example, an organic light-emitting element. In one embodiment, the organic electronic element may be a top-emission type organic light-emitting element or a bottom-emission type organic light-emitting element. When the organic electronic element is the top-emission type organic light-emitting element or the bottom-emission type organic light-emitting element, the above-described encapsulation film may be positioned at the side to which light is transmitted. That is, for example, when the organic electronic element is the top-emission type organic light-emitting element, an encapsulation film may be provided such that the encapsulation film encapsulates the front surface of organic electronic element. However, when the organic electronic element is the bottom-emission type organic light-emitting element, an encapsulation film may be positioned on another surface of the substrate having an element formed on one surface thereof.

Further, the present application relates to a method of producing an organic electronic device. For example, the organic electronic device may be prepared by applying the above-described encapsulation film.

In an organic electronic device, the encapsulating layer may be formed as a structural encapsulating layer which exhibits excellent moisture barrier properties and optical properties, and effectively fix and support the substrate and a barrier film or the like applied in an organic electronic device.

Further, the encapsulating layer exhibits excellent transparency, and thus, may be formed as a stable encapsulating layer regardless of the type of an organic electronic device such as a top emission type, a bottom emission type, etc.

For example, the method of producing an organic electronic device according to the embodiment of the present application may include forming an organic electronic element on one surface of a substrate; and forming the above-described encapsulation film on the other surface of the substrate to manufacture an organic electronic device. Further, the forming of the moisture barrier layer on the organic electronic element may be additionally included. Further, the curing of the encapsulation film may be additionally included.

The applying of the encapsulation film onto the organic electronic device may be performed using a hot-roll lamination method, a hot press method or a vacuum compression method, but the application method is not particularly limited.

The applying of the encapsulation film onto the organic electronic device may be performed at a temperature in the range of 50 to 90° C., and curing the encapsulation film may follow. The curing of the encapsulation film may be performed by heating at a temperature in the range of 70 to 110° C. and irradiating with UV rays.

In the method of manufacturing an organic electronic device according to the embodiment of the present application, for example, a transparent electrode is formed on a glass or film-type substrate 21 using a vacuum-evaporation method, a sputtering method, or the like, and then an organic material layer is formed on the transparent electrode. The organic material layer may include a hole injection layer, a hole transport layer, a light-emitting layer, an electron injection layer, and/or an electron transport layer. Subsequently, a second electrode is further formed on the organic material layer. Thereafter, the above-described moisture barrier layer 6 is applied on an organic electronic element 23 on the substrate 21 so as to cover the organic electronic element 23. Further, the above-described moisture barrier layer 6 is formed on the other surface of the substrate, on which the organic electronic element 23 is not formed.

Further, according to the embodiment of the present application, an additional curing process may be performed with respect to a moisture barrier layer or an encapsulating layer to which an organic electronic device is compressed. For example, the curing process (primary curing) may be performed in a heat chamber or UV chamber, and preferably, may be performed in a heat chamber. The conditions on primary curing may be suitably selected in consideration of stability of an organic electronic device, etc.

EFFECTS

The present application provides an encapsulation film and an organic electronic device which can effectively prevent the penetration of moisture or oxygen from the outside into an organic electronic device, and can also achieve the light diffusion and extraction effects.

DESCRIPTION OF REFERENCE NUMERALS

Figure 1:
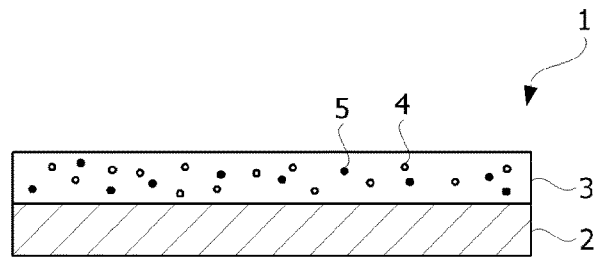
FIGS. 1 and 2 are cross-sectional views of an encapsulation film according to an embodiment of the present application.
Figure 2:
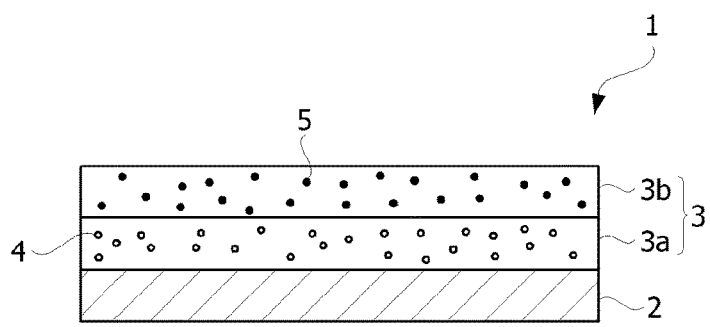
Figure 3:
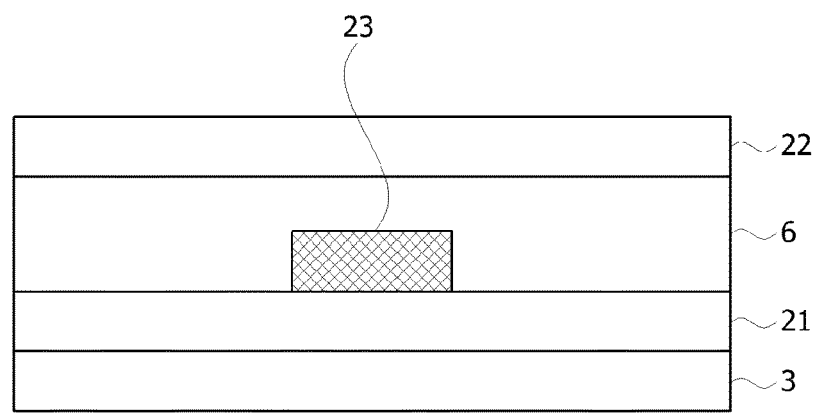
FIG. 3 is a cross-sectional view of an organic electronic device according to the embodiment of the present application.

1: encapsulation film
2: base film or release film
3: encapsulating layer
3a: first layer
3b: second layer
4: hygroscopic filler
5: non-hygroscopic filler
21: substrate
22: cover substrate
23: organic electronic element

DETAILED DESCRIPTION OF EXEMPLARY EMBODIMENTS

Hereinafter, the present application will be described in detail with reference to examples according to the present application and comparative examples not according to the present application, but the scope of the present application is not intended to be limited to the following examples.

Example 1

Silica (refractive index: 1.46) having an average particle diameter of about 1 μm as a non-hygroscopic filler was introduced into methyl ethyl ketone (MEK) as a solvent, such that the concentration of the solid fraction of the silica is 20 wt %, and thereby a non-hygroscopic filler dispersion was prepared. Further, 100 g of CaO (manufactured by Sigma-Aldrich Co. LLC., average particle diameter: about 1 μm, refractive index: 1.83) as a hygroscopic filler was introduced into methyl ethyl ketone (MEK) as a solvent, such that the concentration of the solid fraction of the CaO is 50 wt %, thereby a hygroscopic filler dispersion was prepared.

200 g of a silane-modified epoxy resin (KSR-177; manufactured by Kukdo Chemical Co., Ltd.) and 150 g of a phenoxy resin (YP-50; manufactured by Dongdo Hwasung) were introduced into a reactor at room temperature, and diluted with methyl ethyl ketone. After 4 g of imidazole (SHIKOKU CHEMICALS CORPORATION), which is a curing agent, was introduced into the homogenized solution, and stirred at high speed for 1 hour, an encapsulating layer solution was prepared. The hygroscopic filler solution and the non-hygroscopic filler solution which were prepared in advance were introduced and mixed into the solution such that the weight ratio of CaO to silica was 5:5 (CaO:silica), and thereby an encapsulating layer solution was prepared.

The encapsulating layer solution was applied on a release surface of a release PET, dried at 130° C. for 3 minutes, an encapsulating layer having a thickness of 40 μm was formed, and thereby an encapsulation film was prepared.

Example 2

Preparation of First Layer Solution 100 g of CaO (manufactured by Sigma-Aldrich Co. LLC., average particle diameter: about 1 μm, refractive index: 1.83) as a hygroscopic filler was introduced into methyl ethyl ketone (MEK) as a solvent, such that the concentration of the solid fraction of the CaO is 50 wt %, and thereby a hygroscopic filler dispersion was prepared. Further, 200 g of a silane-modified epoxy resin (KSR-177; manufactured by Kukdo Chemical Co., Ltd.) and 150 g of a phenoxy resin (YP-50; manufactured by Dongdo Hwasung) were introduced into a reactor at room temperature, and diluted with methyl ethyl ketone. After 4 g of imidazole (SHIKOKU CHEMICALS CORPORATION), which is a curing agent, was introduced into the homogenized solution, and stirred at high speed for 1 hour, an encapsulating layer solution was prepared.

The hygroscopic filler solution which was prepared in advance was introduced and mixed into the encapsulating layer solution such that the weight ratio of the hygroscopic filler to a non-hygroscopic filler which will be described below was 5:5 (CaO:silica), and thereby a first layer solution was prepared.

Preparation of Second Layer Solution

Silica (refractive index: 1.46) having an average particle diameter of about 1 μm as a non-hygroscopic filler was introduced into methyl ethyl ketone (MEK) as a solvent, such that the concentration of the solid fraction of the silica is 20 wt %, and thereby a non-hygroscopic filler dispersion was prepared. Further, 200 g of a silane-modified epoxy resin (KSR-177; manufactured by Kukdo Chemical Co., Ltd.) and 150 g of a phenoxy resin (YP-50; manufactured by Dongdo Hwasung) were introduced into a reactor at room temperature, and diluted with methyl ethyl ketone. After 4 g of imidazole (SHIKOKU CHEMICALS CORPORATION), which is a curing agent, was introduced into the homogenized solution, and stirred at high speed for 1 hour, an encapsulating layer solution was prepared.

The non-hygroscopic filler solution which was prepared in advance was introduced and mixed into the encapsulating layer solution such that the weight ratio of the above-described hygroscopic filler to the non-hygroscopic filler was 5:5 (CaO:silica), and thereby a second layer solution was prepared.

Preparation of Encapsulation Film

The prepared first layer solution was applied on a release surface of a release PET using a comma coater, dried at 130° C. for 3 minutes, and thereby a first layer having a thickness of 20 μm was formed.

The prepared second layer solution was applied on a release surface of a release PET using a comma coater, dried at 130° C. for 3 minutes, and thereby a second layer having a thickness of 20 μm was formed.

The first layer and the second layer were laminated, and thereby an encapsulation film was prepared.

Example 3

An encapsulation film was prepared in the same manner as in Example 1 except that, in preparing an encapsulating layer solution, 90 g of a butyl rubber (BUTYL 301; manufactured by Lanxess) as an encapsulation resin, 10 g of a hydrogenated DCPD-based tackifier resin (SU-90; manufactured by Kolon Industries, Inc.) as a tackifier, 15 g of tricyclodecane dimethanol diacrylate (M262; manufactured by Miwon Commercial Co., Ltd.) as an active energy ray-polymerizable compound, and 1 g of 2,2-dimethoxy-1,2-diphenylethane-1-one (Irgacure 651; manufactured by Ciba Specialty Chemicals) as a radical initiator were introduced, and diluted with toluene such that the concentration of a solid fraction is 15 wt %, and thereby an encapsulating layer solution was prepared.

Comparative Example 1

An encapsulation film was prepared in the same manner as in Example 1 except that, in preparing an encapsulating layer solution, an acrylic pressure-sensitive adhesive which included n-butyl acrylate at 99 parts by weight and 2-hydroxyethyl methacrylate at 1 part by weight, and had a molecular weight (Mw) of about 1,800,000, trimethylolpropane triglycidylether which is a multi-functional epoxy compound, triarylsulfonium hexafluoroantimonate which is a photo-cationic initiator and gamma-glycidoxypropyl trimethoxysilane were mixed, diluted at a suitable concentration, and thereby an encapsulating layer solution was prepared.

Comparative Example 2

An encapsulation film was prepared in the same manner as in Example 1 except that a hygroscopic filler solution and a non-hygroscopic filler solution were introduced and mixed such that the weight ratio of CaO to silica was 5:15 (CaO:silica), and thereby an encapsulating layer solution was prepared.

1. Relative Luminance

Encapsulation films prepared according to the examples and comparative examples were applied to one surface of glass on which an organic electronic element was formed, and thereby an organic electronic device was prepared. The encapsulation films were laminated such that the encapsulation films were positioned in a direction of light from an organic electronic device. After the laminating, the films passed through an autoclaving process to prepare panels, and relative luminance was measured using a display color analyzer. As the relative luminance, the relative value of organic electronic devices with encapsulation films according to each example and comparative example was measured based on a reference sample with a luminance of 100.

2. Moisture Barrier Properties

An element to be tested was deposited on a glass substrate. The encapsulating layer according to each example and comparative example was laminated with heat on an encapsulating glass substrate, pressed with a pressure of 5 kg/cm$^2$ while the encapsulating layer was heated at 80° C. on a substrate, and vacuum-compressed for 3 minutes. The vacuum-compressed sample was examined to determine whether dark spots were generated or not under conditions of 85° C., 85% RH, a constant temperature and constant humidity. The sample was observed for 300 hours, and checked as to whether no dark spot was generated (good) or dark spots were generated (failure).

3. Light Transmittance and Haze

With respect to the prepared encapsulation film, light transmittance at a wavelength of 550 nm was measured using a UV-Vis spectrometer, and haze was measured using a haze meter according to a JIS K 7105 standard test method.

TABLE 1

|  | Relative luminance | Moisture barrier properties | Light transmittance | Haze |
|---|---|---|---|---|
| Reference sample | 100 | Failure | 97 | 1 |
| Example 1 | 104 | Good | 84 | 75 |
| Example 2 | 105 | Good | 83 | 78 |
| Example 3 | 103 | Good | 85 | 77 |
| Comparative Example 1 | 105 | Failure | 85 | 72 |
| Comparative Example 2 | 99 | Good | 79 | 89 |

In Table 1, the data of a reference sample is the data of an encapsulation film prepared in the same manner as in Example 1 except that none of a hygroscopic filler and a non-hygroscopic filler was introduced. In the case of Comparative Example 1, optical properties were obtained at a level desired in the embodiment of the present application, but the moisture barrier properties were significantly reduced, and in the case of Comparative Example 2, moisture barrier properties were obtained at a level desired in the embodiment of the present application, but relative luminance decreased.

What is claimed is:

1. An organic electronic device comprising:
   a substrate;
   an organic electronic element formed on one surface of the substrate; and
   an encapsulation film formed on the opposite surface of the substrate,
   wherein the encapsulation film comprises: an encapsulating layer which comprises an encapsulation resin, a hygroscopic filler at 1 to 40 parts by weight, and a non-hygroscopic filler at 1 to 10 parts by weight, and has a water vapor transmission rate of 50 g/m$^2$·day or less in a thickness direction when the encapsulating layer is cured,
   wherein the water vapor transmission rate is measured under conditions of 38° C. and a relative humidity of 100%, and is measured according to ASTM F1249,
   wherein a light transmittance of the encapsulation film is 80% or more with respect to a visible light region, and a haze of the encapsulation film is 50% or more, and
   wherein the encapsulation film is applied to the opposite surface through which light is transmitted by the organic electronic device.

2. The organic electronic device of claim 1, wherein the encapsulating layer comprises a first layer having the hygroscopic filler and a second layer having the non-hygroscopic filler.

3. The organic electronic device of claim 1, wherein an average particle diameter of the hygroscopic filler is in a range of 10 nm to 5 μm.

4. The organic electronic device of claim 1, wherein the hygroscopic filler is one or more selected from the group consisting of a metal oxide, a metal salt, and phosphorus pentoxide.

5. The organic electronic device of claim 4, wherein the hygroscopic filler is one or more selected from the group consisting of CaO, MgO, CaCl$_2$, CaCO$_3$, CaZrO$_3$, CaTiO$_3$, SiO$_2$, Ca$_2$SiO$_4$, MgCl$_2$, P$_2$O$_5$, Li$_2$O, Na$_2$O, BaO, Li$_2$SO$_4$, Na$_2$SO$_4$, CaSO$_4$, MgSO$_4$, CoSO$_4$, Ga$_2$(SO$_4$)$_3$, Ti(SO$_4$)$_2$, NiSO$_4$, SrCl$_2$, YCl$_3$, CuCl$_2$, CSF, TaF$_5$, NbF$_5$, LiBr, CaBr$_2$, CeBr$_3$, SeBr$_4$, VBr$_3$, MgBr$_2$, BaI$_2$, MgI$_2$, Ba(ClO$_4$)$_2$ and Mg(ClO$_4$)$_2$.

6. The organic electronic device of claim 1, wherein an average particle diameter of the non-hygroscopic filler is in a range of 500 nm to 10 μm.

7. The organic electronic device of claim 1, wherein a refractive index difference between the encapsulation resin and the non-hygroscopic filler is in a range of 0.1 to 1.0.

8. The organic electronic device of claim 1, wherein the non-hygroscopic filler comprises titanium dioxide (TiO$_2$), alumina (Al$_2$O$_3$), silicon nitride (Si$_3$N$_4$), aluminum nitride (AlN), gallium nitride (GaN), zinc sulfide (ZnS), cadmium sulfide (CdS), silica, talc, zeolite, titania, zirconia, montmorillonite, or clay.

9. The organic electronic device of claim 1, wherein the encapsulation resin is an acrylic resin, an epoxy resin, a silicone resin, a fluorine resin, a styrene resin, a polyolefin resin, a thermoplastic elastomer, a polyoxyalkylene resin, a polyester resin, a polyvinyl chloride resin, a polycarbonate resin, a polyphenylene sulfide resin, a polyamide resin, or a mixture thereof.

10. The organic electronic device of claim 1, wherein the encapsulating layer further comprises a dispersant.

11. The organic electronic device of claim 10, wherein the dispersant is one or more selected from the group consisting of stearic acid, palmitic acid, oleic acid, linoleic acid, cetyl alcohol, stearyl alcohol, cetostearyl alcohol, oleyl alcohol, octyl glucoside, decyl glucoside and lauryl glucoside.

12. The organic electronic device of claim 10, wherein the dispersant is included at 0.1 to 5 parts by weight with respect to 100 parts by weight of the hygroscopic filler and the non-hygroscopic filler.

13. The organic electronic device of claim 1, wherein the organic electronic element is an organic light emitting diode.

14. The organic electronic device of claim 1, further comprising a moisture barrier layer formed on the organic electronic element.

15. A method of manufacturing the organic electronic device of claim 1, comprising:
   forming the organic electronic element on one surface of the substrate; and
   forming the encapsulation film on the other surface of the substrate.

* * * * *